United States Patent
Shin

(10) Patent No.: US 11,483,422 B2
(45) Date of Patent: Oct. 25, 2022

(54) PRINTED CIRCUIT BOARD AND ELECTRONIC DEVICE COMPRISING THE SAME

(71) Applicant: SAMSUNG ELECTRO-MECHANICS CO., LTD., Suwon-si (KR)

(72) Inventor: Jae Ho Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 361 days.

(21) Appl. No.: 16/788,073

(22) Filed: Feb. 11, 2020

(65) Prior Publication Data

US 2020/0412857 A1    Dec. 31, 2020

(30) Foreign Application Priority Data

Jun. 28, 2019 (KR) .................. 10-2019-0077575
Jul. 31, 2019 (KR) .................. 10-2019-0093173

(51) Int. Cl.
| | | |
|---|---|---|
| *H04M 1/02* | (2006.01) | |
| *H05K 1/14* | (2006.01) | |
| *H01R 12/71* | (2011.01) | |

(52) U.S. Cl.
CPC .......... *H04M 1/0277* (2013.01); *H05K 1/148* (2013.01); *H01R 12/716* (2013.01); *H05K 2201/09027* (2013.01); *H05K 2201/10083* (2013.01); *H05K 2201/10121* (2013.01); *H05K 2201/10189* (2013.01)

(58) Field of Classification Search
CPC ............. H04M 1/0277; H05K 1/148; H05K 2201/09027; H05K 2201/10083; H05K 2201/10121; H05K 2201/10189; H01R 12/716
See application file for complete search history.

(56) References Cited

U.S. PATENT DOCUMENTS

| | | |
|---|---|---|
| 10,064,276 B2 | 8/2018 | Williams et al. |
| 2017/0118838 A1* | 4/2017 | Williams ............... H05K 1/148 |
| 2017/0358847 A1* | 12/2017 | Cho ....................... H05K 1/0218 |
| 2020/0337642 A1* | 10/2020 | Garai ................. A61B 5/14532 |
| 2021/0136913 A1* | 5/2021 | Barink ................. H05K 1/0283 |

FOREIGN PATENT DOCUMENTS

| | | |
|---|---|---|
| JP | 2005-175339 A | 6/2005 |
| JP | 2010-153928 A | 7/2010 |

* cited by examiner

*Primary Examiner* — Wesley L Kim
*Assistant Examiner* — Angelica M Perez
(74) *Attorney, Agent, or Firm* — Morgan, Lewis & Bockius LLP

(57) ABSTRACT

The present disclosure relates to a printed circuit and an electronic device including the same. The printed circuit board includes a first substrate having a through portion, a second substrate disposed in the through portion of the first substrate, and in which at least a portion of a side surface thereof is surrounded by the first substrate, and a flexible substrate disposed in the through portion of the first substrate and connecting the first and second substrates.

7 Claims, 11 Drawing Sheets

PRINTED CIRCUIT BOARD AND ELECTRONIC DEVICE COMPRISING THE SAME

CROSS-REFERENCE TO RELATED APPLICATION(S)

This application claims benefit of priority to Korean Patent Application Nos. 10-2019-0077575 filed on Jun. 28, 2019 in the Korean Intellectual Property Office, and 10-2019-0093173 filed on Jul. 31, 2019 in the Korean Intellectual Property Office, the disclosures of which are incorporated herein by reference in their entirety.

TECHNICAL FIELD

The present disclosure relates to a printed circuit board and an electronic device comprising the same.

BACKGROUND

In electronic devices such as smartphones, as an importance of camera performance continues to increase, pixels of cameras or the number of cameras have increased. In addition, to improve multimedia utilization, a speaker of an upper earpiece may also be larger than a certain size. Thus, a space for disposing the camera module and/or the speaker is also continuously increasing. Therefore, in recent years, securing a component mounting space of a mainboard has emerged as an important technology.

SUMMARY

An aspect of the present disclosure is to provide a printed circuit board that can secure sufficient component mounting space through efficient space utilization, and an electronic device including the same. In addition, another aspect of the present disclosure is to provide a printed circuit board that can have a multilayer structure formed using a relatively simple process and can reduce costs, and an electronic device including the same.

An aspect of the present disclosure is to provide a printed circuit board in which first and second substrates are connected by a flexible substrate, and in this case, the second substrate and the flexible substrate are disposed in a through portion formed in the first substrate before the flexible substrate is bent. In addition, another aspect of the present disclosure is to provide an electronic device. In the electronic device, a flexible substrate may be bent in the above-described printed circuit board and a multilayer structure may be implemented by first and second substrates, and in this case, electronic components may be mounted on the first and second substrates, respectively, and the electronic components may be further disposed separately in the through portion.

According to an aspect of the present disclosure, a printed circuit board may include: a first substrate having a through portion; a second substrate disposed in the through portion of the first substrate, at least a portion of a side surface of the second substrate being surrounded by the first substrate; and a flexible substrate disposed in the through portion of the first substrate and connecting the first and second substrates.

According to an aspect of the present disclosure, an electronic device may include a printed circuit board including a first substrate having a through portion; a flexible substrate connected to the first substrate in the through portion; a second substrate connected to the flexible substrate and disposed on the first substrate such that at least a portion thereof overlaps the first substrate on a plane; a first electronic component disposed on at least one surface of the first substrate; and a second electronic component disposed on at least one surface of the second substrate.

According to an aspect of the present disclosure, a printed circuit board may include a first substrate having a through portion; a second substrate; and a flexible substrate extending from an edge of the through portion and connected to the second substrate. The second substrate may be rotatable along the flexible substrate between a first position in which the second substrate is disposed in the through portion and a second position in which the second substrate overlaps the first substrate.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Electronic Device

Figure 1:
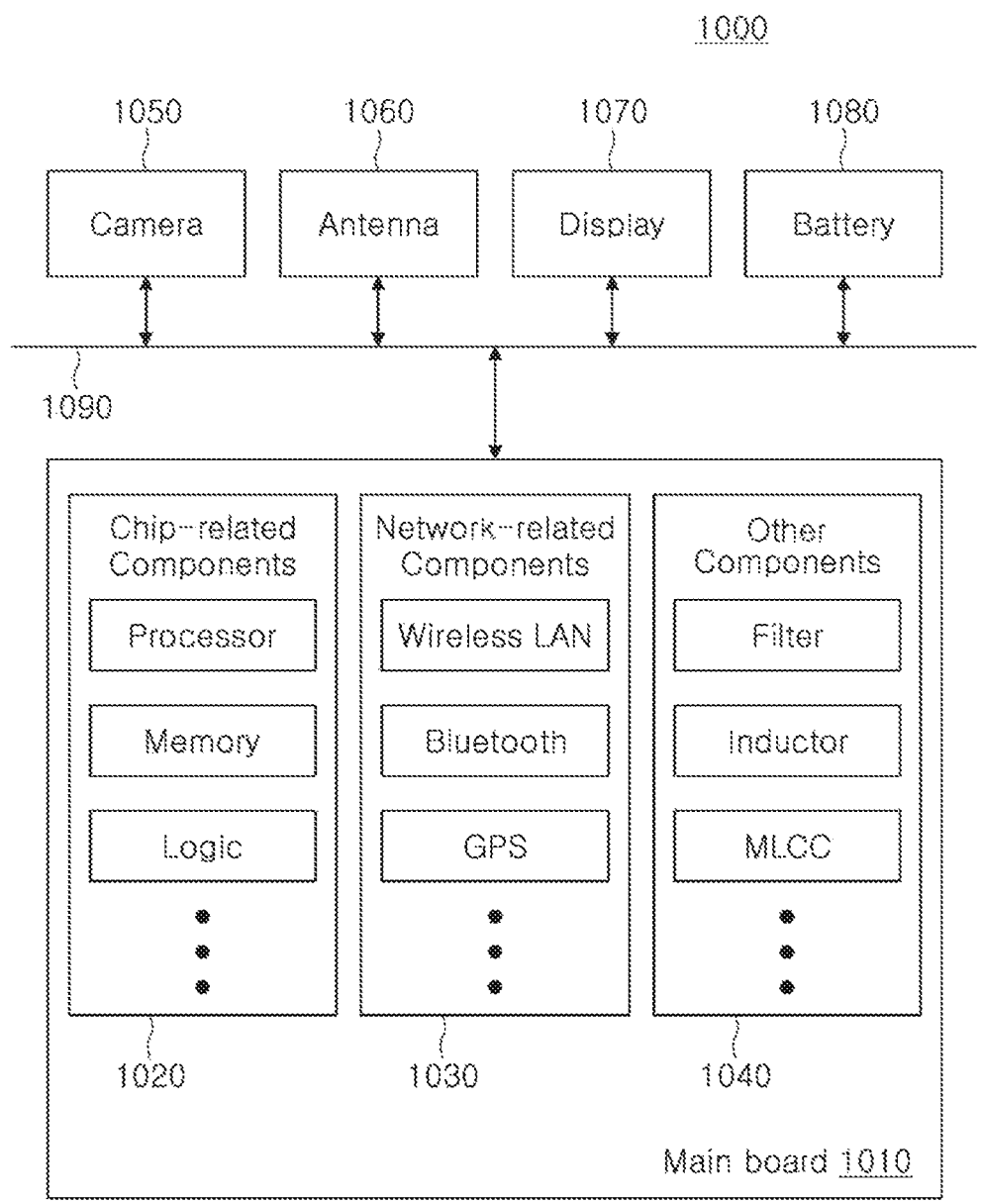
FIG. 1 is a schematic block diagram illustrating an example of an electronic device system.

FIG. 1 is a schematic block diagram illustrating an example of an electronic device system.

Referring to FIG. 1, an electronic device 1000 may receive a main board 1010. The main board 1010 may include chip related components 1020, network related components 1030, other components 1040, or the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip related components 1020 are not limited thereto, and may include other types of chip related components. In addition, the chip related components 1020 may be combined with each other. The chip related components 1020 may have a package form including the chip and the electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 includes other components that may or may not be physically or electrically connected to the main board 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
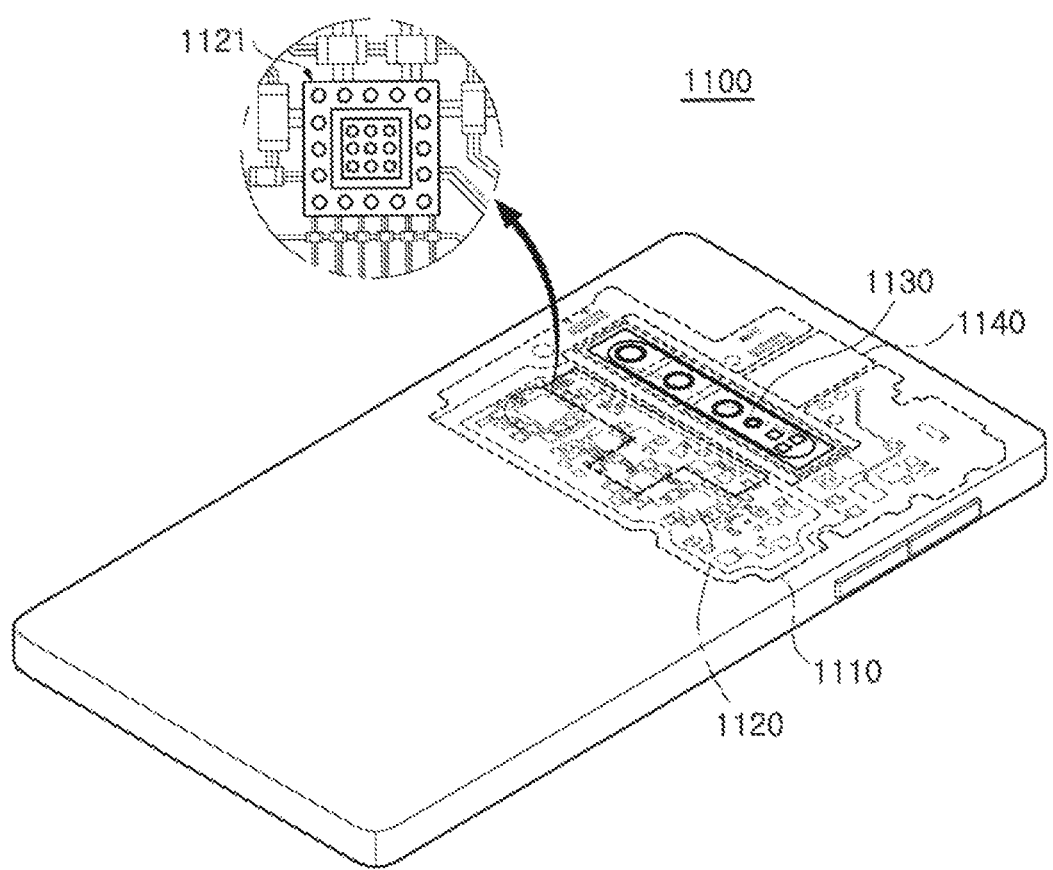
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other components that may or may not be physically or electrically connected to the printed circuit board 1110, such as a camera module 1130 and/or a speaker 1140, may be accommodated in the mainboard 1110. A portion of the electronic components 1120 may be chip related components, for example, a semiconductor package 1121, but are not limited thereto. The semiconductor package 1121 may be a surface mounted type package, such as a semiconductor chip or a passive component on a package board of a multilayer printed circuit board, but is not limited thereto. Meanwhile, the electronic device is not necessarily limited to the smartphone 1100, but may be other electronic devices as described above.

Printed Circuit Board

Figure 3:
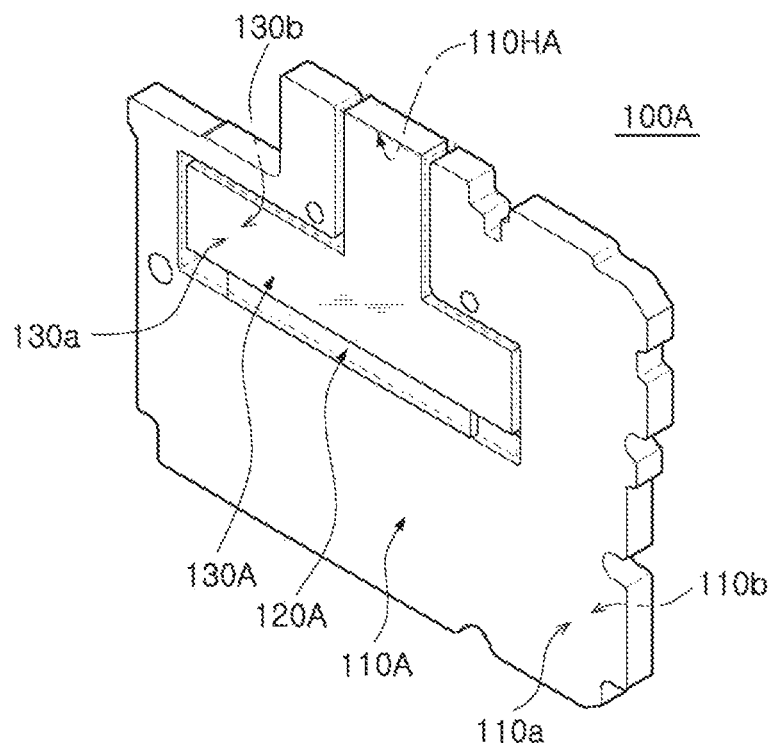
FIG. 3 is a schematic perspective view illustrating an example of a printed circuit board.
Figure 4:
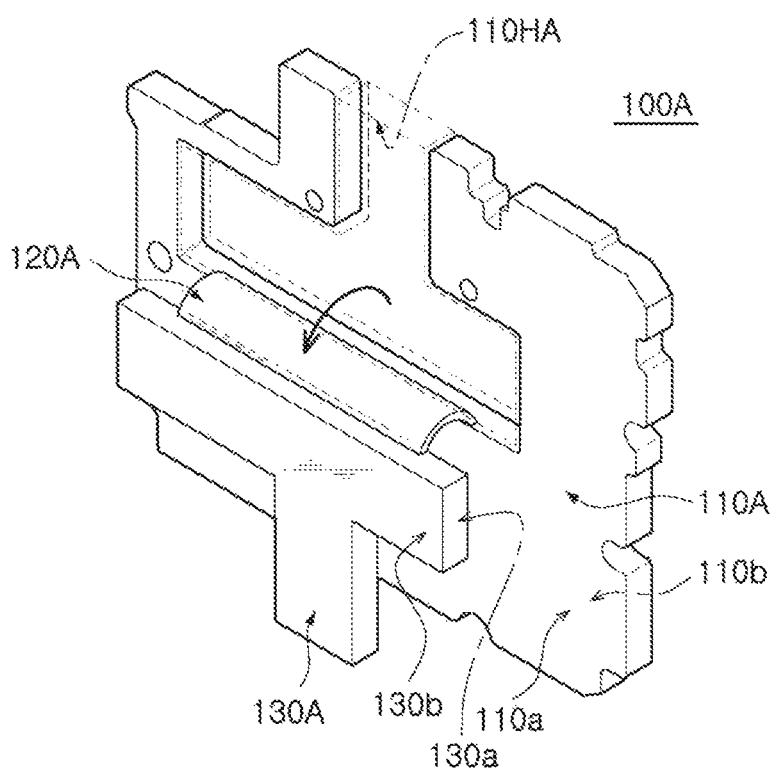
FIG. 4 is a schematic perspective view illustrating a condition after a flexible substrate of the printed circuit board of FIG. 3 is bent.

FIG. 3 is a schematic perspective view illustrating an example of a printed circuit board, and FIG. 4 is a schematic perspective view illustrating a condition after a flexible substrate of the printed circuit board of FIG. 3 is bent.

Figure 5A:
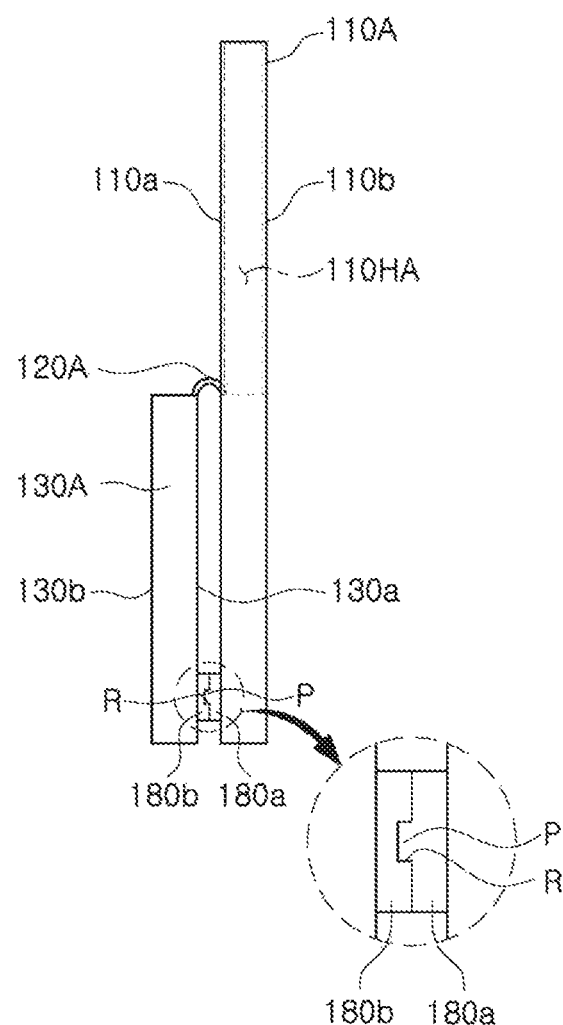
FIGS. 5A and 5B are schematic cross-sectional views illustrating that first and second connectors are applied between first and second substrates after the flexible substrate of the printed circuit board of FIG. 3 is bent.
Figure 5B:
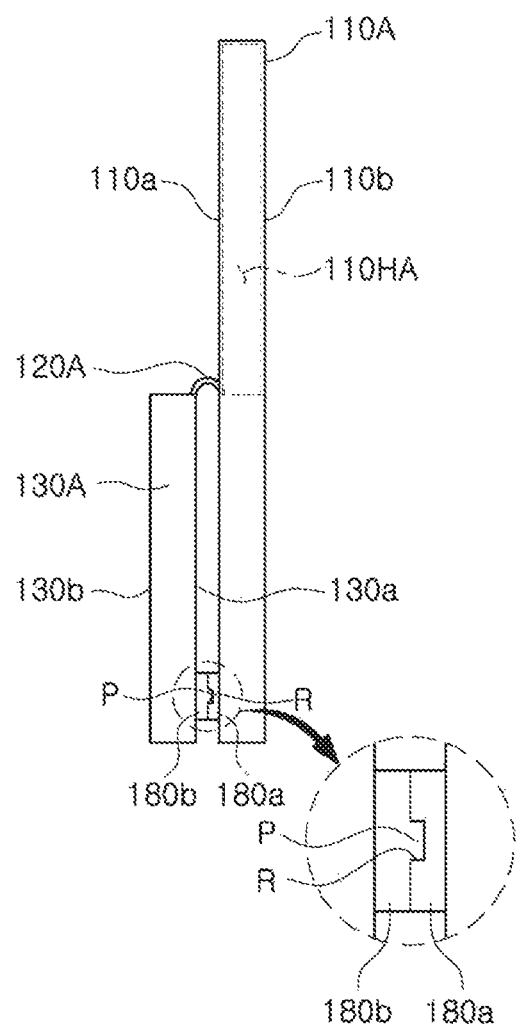

FIGS. 5A and 5B are schematic cross-sectional views illustrating that first and second connectors are applied between the first and second substrates after the flexible substrate of the printed circuit board of FIG. 3 is bent.

Figure 6A:
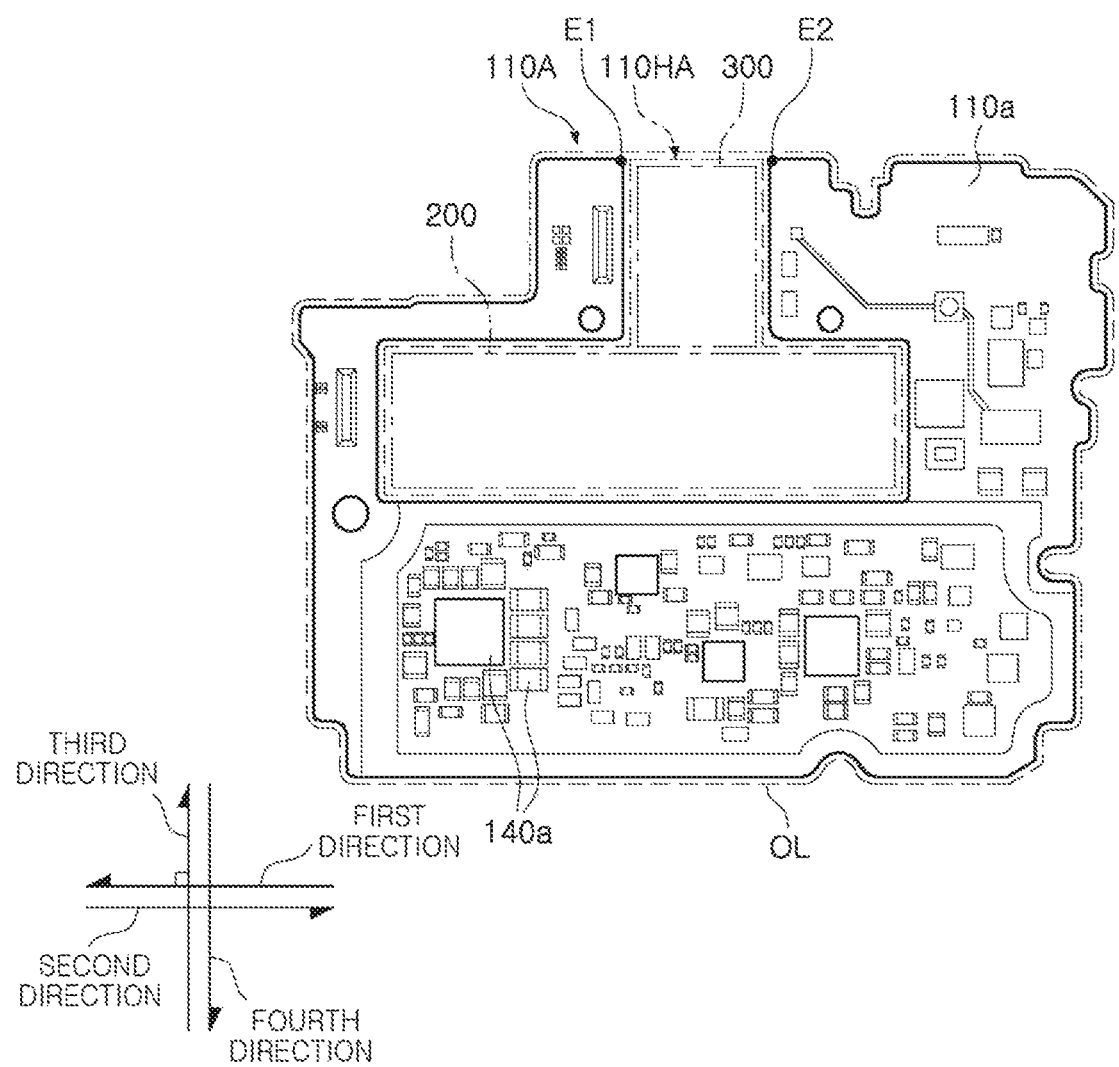
FIGS. 6A and 6B are schematic plan views illustrating first and second surfaces of a first substrate of the printed circuit board of FIG. 3, respectively.
Figure 6B:
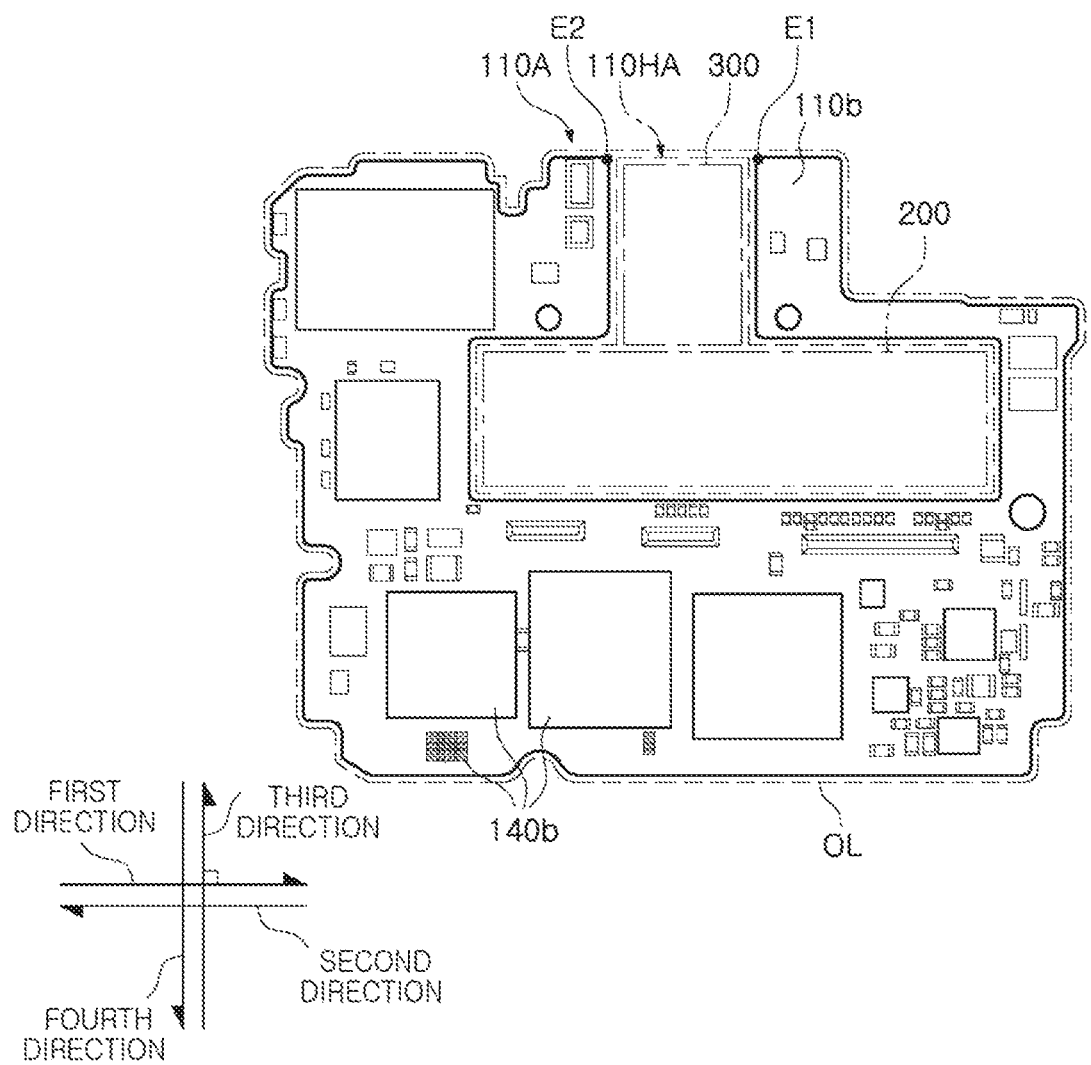
Figure 7A:
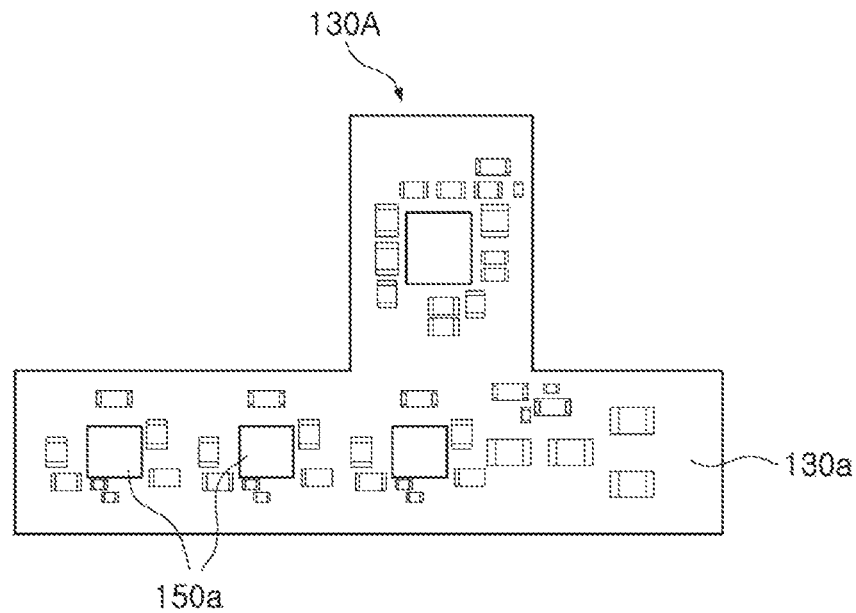
FIGS. 7A and 7B are schematic plan views illustrating third and fourth surfaces of a second substrate of the printed circuit board of FIG. 3, respectively.
Figure 7B:
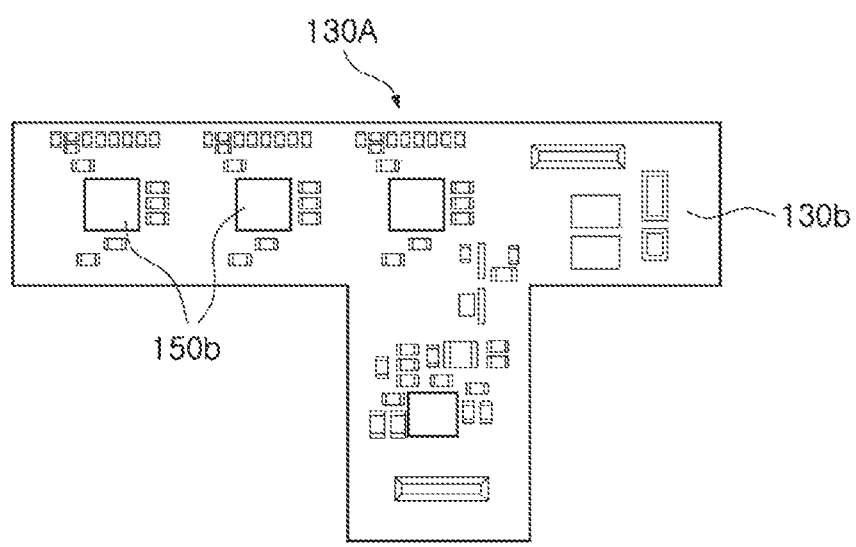

FIGS. 6A and 6B are schematic plan views illustrating a first surface and a second surface of a first substrate of the printed circuit board of FIG. 3, respectively, and FIGS. 7A and 7B are schematic plan views illustrating third and fourth surface of a second substrate of the printed circuit board of FIG. 3, respectively.

Referring to the drawings, a printed circuit board 100A according to an example includes: a first substrate 110A having a first surface 110*a* and a second surface 110*b*, opposite to the first surface 110*a*, and having a through portion 110HA penetrating between the first and second surfaces 110*a* and 110*b*; a flexible substrate 120A connected to the first substrate 110A in the through portion 110HA; and a second substrate 130A connected to the flexible substrate 120A and having a third surface 130*a* and a fourth surface 130*b*, opposite to the third surface 130*a*. In this case, as shown in FIG. 3, before the flexible substrate 120A is bent, the second substrate 130A may be disposed in the through portion 110HA, and at least a portion of a side surface thereof may be surrounded by the first substrate 110A. Meanwhile, in an example, since the through portion 110HA has an exposed region, before the flexible substrate 120A is bent, the second substrate 130A may be disposed in the through portion 110HA, but if necessary, a portion thereof may escape the through portion 110HA through the exposed region. That is, being disposed in the through portion 110HA does not necessarily mean that an entire configuration is disposed therein. The flexible substrate 120A may connect the first and second substrates 110A and 130A in the through portion 110HA of the first substrate 110A. For example, one side of the flexible substrate 120A may be connected to a side surface of the through portion 110H of the first substrate 110A, and the other side thereof may be connected to a side surface of the second substrate 130A. In addition, as shown in FIG. 4, after the flexible substrate 120A is bent, the second substrate 130A may be disposed on the first substrate 110A, and at least a portion of each of the first substrate 110A and the second substrate 130A may overlap each other on a plane.

Meanwhile, as described above, in an electronic device such as a smartphone, the importance of camera performance continues to increase, the pixels of cameras or the number of cameras increases together therewith. In addition, to improve multimedia utilization, a speaker of an upper earpiece is also larger than a certain size. For this reason, a space for disposing the camera module and/or the speaker on a mainboard is also continuously increasing. Therefore, in recent years, securing a component mounting space of the mainboard has emerged as an important technology. For example, applying a multilayer structure printed circuit board as a mainboard of a smartphone may be considered. To this end, preparing a main printed circuit board and a sub printed circuit board, and connecting the main printed circuit board and the sub printed circuit board up and down using an interposer substrate may also be considered. However, at least three separately manufactured boards are used for the multilayer structure printed circuit board, and in addition to a process of mounting components on these boards, a separate assembly process for stacking up and down and connecting these substrates is required, such that a manufacturing process may be elongated and costs may increase due to occurrence of defects in the manufacturing process.

On the other hand, in the printed circuit board 100A according to an example, the first substrate 110A may have a through portion 110HA, and before the flexible substrate 120A is bent, the flexible substrate 120A and the second substrate 130A may be disposed in the through portion 110HA. That is, even before it is applied to the electronic device, basically, it has efficient space utilization. In addition, after the flexible substrate 120A is bent, the second substrate 130A may be disposed on the first substrate 110A by bending the flexible substrate 120A. For example, it may have a multilayer structure without having a separate interposer substrate or a sub substrate. In addition, since a separate assembly process is unnecessary, the manufacturing process becomes relatively simple, and costs may be reduced.

Meanwhile, in the printed circuit board 100A according to an example, first and second connectors 180a and 180b may be disposed between the first and second substrates 110A and 130A in a state of the multilayer structure after the flexible substrate 120A is bent. For example, as shown in FIGS. 5A and 5B, a first connector 180a may be disposed on the first surface 110a of the first substrate 110A facing the second substrate 130A. In addition, a second connector 180b may be disposed on the third surface 130a of the second substrate 130A facing the first substrate 110A. The first and second connectors 180a and 180b may be connected to each other. In this case, the first and second substrates 110A and 130A may be electrically connected to each other by a path through the first and second connectors 180a and 180b in addition to a path through the flexible substrate 120A. For example, signals having a path through the wiring layers of each of the first and second substrates 110A and 130A may also be electrically connected to each other through the first and second connectors 180a and 180b. Meanwhile, in the first and second connectors 180a and 180b, as shown in FIG. 5A, the first connector 180a may have a convex portion P, and the second connector 180b may have a concave portion R. Alternatively, in the first and second connectors 180a and 180b, as shown in FIG. 5B, the first connector 180a may have a concave portion R, and the second connector 180b may have a convex portion P. The first and second connectors 180a and 180b may be coupled and connected to each other by the concave portion R and the convex portion P.

Meanwhile, if necessary, one or more spacers may be further disposed between the first and second substrates 110A and 130A in a state of a multilayer structure after the flexible substrate 120A is bent. For example, one or more spacers may be disposed between the first surface 110a of the first substrate 110A and the third surface 130a of the second substrate 130A. Thereby, in the state of the multilayer structure after the flexible substrate is bent, the second substrate 130A may be stably disposed on the first substrate 110A. The spacer may be physically contact the first surface 110a of the first substrate 110A and the third surface 130a of the second substrate 130A, respectively. The spacer may be thicker than a thickness of each of first and third electronic components 140a and 150a described later. The spacer may be made of various materials, and the shapes, or the like are not particularly limited. For example, the spacer may be an insulating film, an insulating substrate, a metal lump, a dummy component, or the like, and the spacer may be that an adhesive film is further attached thereto.

Meanwhile, in the printed circuit board 100A according to an example, in the state of the multilayer structure after the flexible substrate 120A is bent, since the through portion 110HA is an empty space in view of the printed circuit board 100A, separate electronic components such as a camera module 200 and/or a speaker 300 may be disposed in the space. For example, when the printed circuit board 100A according to an example is used as a mainboard of an electronic device such as the smartphone described above, as shown in FIGS. 6A and 6B, the first and second electronic components 140a and 140b may be disposed on the first and/or second surfaces 110a and 110b of the first substrate 110A, and as shown in FIGS. 7A and 7B, third and/or fourth electronic components 150a and 150b may be disposed on the third and/or fourth surfaces 130a and 130b of the second substrate 130A. As shown in FIGS. 6A and 6B, separate fifth electronic components 200 and 300 that are not directly mounted on the printed circuit board 100A, for example, the camera module 200 and/or the speaker 300 may be disposed in the through portion 110HA, which remains empty in terms of the printed circuit board 100A after it is bent. Meanwhile, the fifth electronic components 200 and 300 may be physically and/or electrically connected to the printed circuit board 100A through a connector, a separate substrate, or the like. For example, it may be electrically connected to at least one wiring layer of the first and second substrates 110A and 130A. If necessary, it may not be connected. The fifth electronic components 200 and 300 may be other types of modules or chip packages, and are not particularly limited. As such, the fifth electronic components 200 and 300 have a multilayer structure having excellent space utilization, they may be usefully used as a mainboard in an electronic device such as a smartphone.

Hereinafter, components of the printed circuit board 100A according to an example will be described in more detail with reference to the accompanying drawings.

The printed circuit board 100A includes the first substrate 110A, the flexible substrate 120A, and the second substrate 130A. In this case, the first and second substrates 110A and 130A may each have superior rigidity than the flexible substrate 120A. Rigidity is excellent, which means that bending properties are relatively less under the same conditions. For example, the printed circuit board 100A according to an example may be a rigid-flexible printed circuit board (RFPCB) having a rigid-flex-rigid form. A cross-sectional structure of the RFPCB applicable to the printed circuit board 100A according to an example is not particularly limited, and may be a known cored type RFPCB having a relatively thick core layer therein, and since it is formed through a coreless process, it may be a known coreless type RFPCB in which the core layer is omitted therein.

The first substrate 110A and the second substrate 130A may include an insulating layer, a wiring layer, and a via layer, respectively. The wiring layer may be disposed on the insulating layer or in the insulating layer. The via layer may electrically connect the wiring layers disposed on different layers while penetrating the insulating layer. The number of layers of the insulating layer, the wiring layer, and the via layer is not particularly limited, and may be a multilayer or a single layer, respectively, depending on designs.

An insulating material may be used as a material of the insulating layer, and in this case, the insulating material may be a thermosetting resin such as epoxy resin, a thermoplastic resin such as polyimide, or a material including a reinforcing material such as glass fiber (or glass cloth, glass fabric) and/or an inorganic filler, for example, prepreg, Ajinomoto Build-up Film (ABF), Photo Image-able Dielectric (PID), or the like may be used. However, the present disclosure is not limited thereto, a glass plate may be used as a material of a specific insulating layer, or a ceramic plate may also be used. If necessary, a liquid crystal polymer (LCP) having a low dielectric loss may be used. When a plurality of insulating layers are used, a material of each insulating layer may be the same or different.

A metal material may be used as a material of the wiring layer, and in this case, the metal material may be copper (Cu), aluminum (Al), silver (Ag), tin (Sn), gold (Au), nickel (Ni), lead (Pb), titanium (Ti), alloys thereof, or the like may be used. The wiring layer may perform various functions depending on a design of a corresponding layer. For example, the wiring layer. For example, the wiring layer may include a ground (GND) pattern, a power (PWR) pattern, a signal (S) pattern, and the like. Here, the signal(S) pattern includes various signals except for the ground pattern (GND) pattern, the power (PWR) pattern, and the like, such as a data signal. If necessary, the ground GND pattern and the power PWR pattern may be the same pattern. These patterns may include a line pattern, a plane pattern, and/or a pad pattern, respectively.

A metal material may also be used as a material of the via layer, and in this case, the metal material may be copper (Cu), aluminum (Al), silver (Ag), tin (Sn), gold (Au), nickel (Ni), lead (Pb), titanium (Ti), alloys thereof, or the like can be used. A connection via of the via layer may be completely filled with a metal material, respectively, or the metal material may be formed along a wall of the via hole. In addition, all known shapes, such as a tapered shape, an hourglass shape, a cylindrical shape, and the like can be applied. The via layer may also perform various functions depending on the design of the corresponding layer. For example, the via layer may include a connection via for signal connection, a connection via for ground connection, a connection via for power connection, and the like. The connection via for ground connection and the connection via for power connection may be the same connection via.

The flexible substrate 120A may basically include an insulating layer, and if necessary, may include a wiring layer and/or a via layer. In this case, a material having sufficient flexibility may be used as a material of the insulating layer. For example, polyimide, polyetherene terephthalate, polyethylene naphthalate, amorphous polyimide, a liquid crystal polymer, or an adhesive including an epoxy resin formulated to lower modulus of elasticity as a main material may be used, but is not limited thereto. For example, other known materials of low elasticity and low rigidity may be used. The wiring layer and/or the via layer may be substantially the same as described above, and thus detailed description thereof will be omitted. The flexible substrate 120A may be more flexible than each of the first substrate 110A and the second substrate 130A. As such, the second substrate 130A may be rotatable along the flexible substrate 120 between two states shown in FIGS. 3 and 4. In one example, a thickness of the flexible substrate 120A may be less than a thickness of each of the first substrate 110A and the second substrate 130A.

The through portion 110HA may penetrate between the first and second surfaces 110a and 110b of the first substrate 110A. As in an example, the through portion 110HA may be surrounded by the first substrate 110A on a plane, and may be exposed from the first substrate 110A in some regions. However, even in this case, most of regions thereof may be surrounded by the first substrate 110A. For example, a length of a side portion surrounded by the first substrate 110A of the through portion 110HA may be longer than a length of a side portion exposed from the first substrate 110H. It may be more preferable to have the through portion 110HA in terms of utilizing a space. Meanwhile, in the present disclosure, the through portion 110HA basically means a space in which at least a portion of the flexible substrate 120A and the second substrate 130A may be accommodated before the flexible substrate 120A is bent. In this regard, before the flexible substrate 120A is bent, a portion of a side surface of the second substrate 130A may be exposed from the first substrate 110A, but only an area of a side surface surrounded by the first substrate 110A of the second substrate 130A may be larger than an area exposed from the first substrate 110A of the second substrate 130A.

Meanwhile, as in FIGS. 6A and 6B, when a first direction is referred to as one direction, substantially perpendicular to any substantially flat one side surface of the first substrate 110A, a second direction is referred to as a direction substantially parallel to the first direction, but being substantially opposite to the first direction, a third direction is referred to as another direction, substantially perpendicular to the third direction, and a fourth direction is referred to as a direction, substantially parallel to the third direction, but being substantially opposite to the third direction, the through portion 110HA may be blocked by the first substrate 110A in at least three directions of the first to fourth directions. For example, in an example, the through portion 110HA may be completely surrounded by the first substrate 110A in the first direction, second, and fourth directions, and may be exposed from the first substrate 110A in some regions in the direction. It may be more preferable to have the through portion 110HA in terms of utilizing a space.

In addition, as shown in FIGS. 6A and 6B, the through portion 110HA may not escape an outline OL of the first substrate 110A. Here, the outline OL may mean a line surrounding an outer side surface of an arbitrary appearance assuming when the through portion 110HA is not formed on the first substrate 110A. For example, as in an example, when there is a region that is recessed inwardly by the formation of the through portion 110HA on the first substrate 110A on a plane, two edges E1 and E2, which becomes a start of the recessed region, may be connected by a virtual line to define an outline OL. Meanwhile, in an example, when there are a plurality of regions to be recessed, a recessed region in which at least a portion of the flexible substrate 120A and the second substrate 130A may be accommodated before the flexible substrate 120A is bent, as described above, may be defined as the through portion 110HA, and the outline OL may be defined by connecting the above-described two edges E1 and E2 in the recessed regions with the virtual line.

Meanwhile, the through portion 110HA may have a shape corresponding substantially to the shape of the second substrate 130A. For example, as shown in FIG. 3, before the flexible substrate 120A is bent, the flexible substrate 120A may have a shape corresponding substantially to the third surface 130a of the second substrate 130A on a plane. In addition, as shown in FIG. 4, after the flexible substrate 120A is bent, the flexible substrate 120A may have a shape corresponding substantially to a symmetrical shape of the shape of the fourth surface 130b of the second substrate 130A on a plane. Here, having a substantially corresponding shape is a concept including not only having exactly the same shape, but also having an outline corresponding to the outline on a plane. In addition, as shown in FIG. 4, after the flexible substrate 120A is bent, the flexible substrate 120A may have a shape corresponding substantially to a symmetrical shape of the shape of the fourth surface 130b of the second substrate 130A on a plane. Here, having a substantially corresponding shape is a concept including not only having exactly the same shape, but also having an outline corresponding to the outline on a plane. For example, in an example, the second substrate 130A may have an approximately T shape when rotated to a specific position, and similarly, the through portion 110HA may also have an approximately T shape when rotated to a specific position.

Meanwhile, the through portion 110HA may have an area on a plane, larger than that of each of the third and fourth surfaces 130a and 130b of the second substrate 130A. In this case, before being bent, the second substrate 130A may be more effectively disposed in the through portion 110A together with the flexible substrate 120A. Therefore, a through portion can be utilized more effectively.

Before being bent, the printed circuit board 100A may have a structure as shown in FIG. 3 or may have a structure after being bent as shown in FIG. 4. In addition, the printed circuit board 100A may have a structure in which the electronic component is not mounted, but may have a structure in which the electronic component is mounted, if necessary. For example, the first electronic component 140a and/or the second electronic component 140b may be disposed on the first surface 110a and/or the second surface 110b of the first substrate 110A, as described above. In addition, the third electronic component 150a and/or the fourth electronic component 150b may be disposed on the third surface 130a and/or the fourth surface 130b of the second substrate 130A, as described above. The first to fourth electronic components 140a, 140b, 150a, and 150b may independently be a chip related component, a network related component, and other components, respectively. These components may be surface-mounted on the printed circuit board 100A, respectively, and may be electrically connected to each other through an internal wiring, or the like, of the printed circuit board 100A. These components may be introduced into a structure before the printed circuit board 100A is bent. Alternatively, it may be introduced into a structure after the printed circuit board 100A is bent.

The chip-related components may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components are not limited thereto, and may include other types of chip-related components. In addition, the chip-related components may be combined with each other. The chip-related component may be in a package form including the chip or the electronic component described above.

The network-related components may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components are not limited thereto, and may also include a variety of other wireless or wired standards or protocols. In addition, the network-related components may be combined with each other, together with the chip-related components described above.

The other components may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components are not limited thereto, and may also include passive components used for various other purposes, or the like. In addition, the other components may be combined with each other, together with the chip-related components and/or the network-related components described above.

Figure 8:
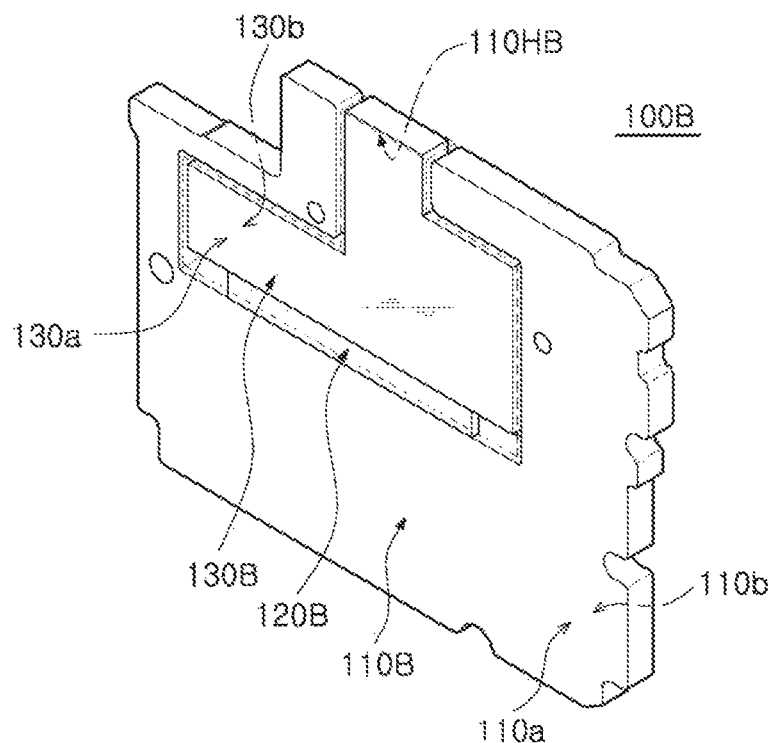
FIG. 8 is a schematic perspective view illustrating another example of a printed circuit board.
Figure 9:
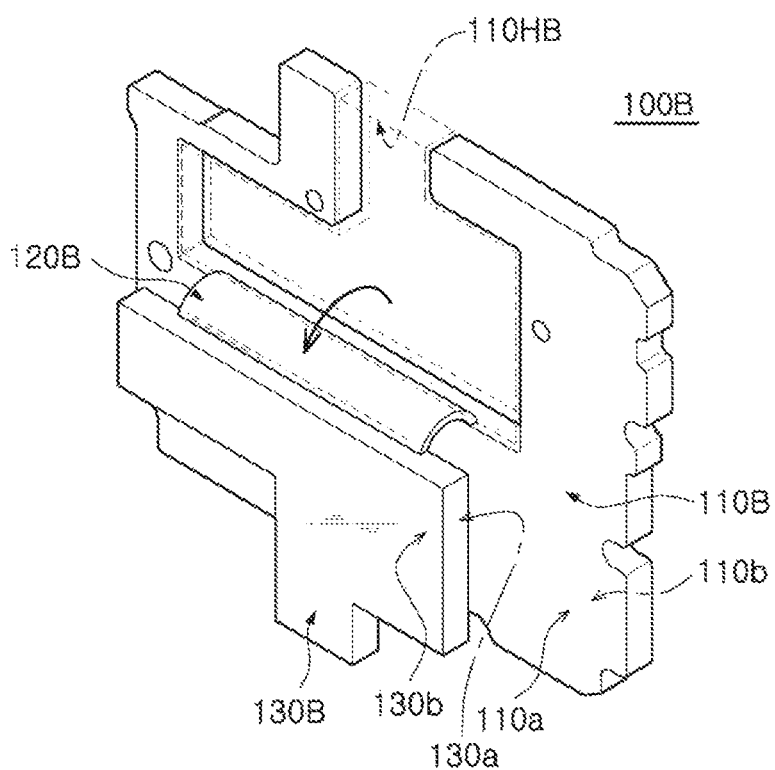
FIG. 9 is a schematic perspective view illustrating a condition after a flexible substrate of the printed circuit board of FIG. 8 is bent.

FIG. 8 is a schematic perspective view illustrating another example of a printed circuit board, and FIG. 9 is a schematic perspective view illustrating a condition after a flexible substrate of the printed circuit board of FIG. 8 is bent.

Referring to FIG. 8, similarly to the printed circuit board 100A according to the example, a printed circuit board 100B according to another example may include a first substrate 110B having a first surface 110a and a second surface 110b, a flexible substrate 120B connected to the first substrate 110B in the through portion 110HB, and a second substrate 130B connected to the flexible substrate 120B and having a third surface 130a and a fourth surface 140b. In this case, as shown in FIG. 8, before the flexible substrate 120B is bent, the second substrate 130B may be disposed in the through portion 110HB, and at least a side surface thereof may be surrounded by the first substrate 110B and at least a portion thereof may be exposed from the first substrate 110B. In addition, the flexible substrate 120B may be disposed between the first and second substrates 110B and 130B in the through portion 110HB to connect the first and second substrates 110B and 130B. In addition, as shown in FIG. 9, after the flexible substrate 120B is bent, the second substrate 130B may be disposed on the first substrate 110B, and at least a portion of each of the first surface 110a of the first substrate 110B and the third surface 130a of the second substrate 130B may overlap each other on a plane. However, the through portion 110HB may have a larger area on a plane than the printed circuit board 100A according to the example, and accordingly, the third surface 130a and the fourth surface 130b of the second substrate 130B may also have a larger area than the printed circuit board 100A according to the example. For example, when the size of the camera module, or the like disposed in the through portion 110HB is increased, the areas of the through portion 110HB and the second substrate 130B may be further increased accordingly.

Other descriptions, for example, inconsistent detailed descriptions on the first and second substrates 110B and 130B, the flexible substrate 120B, the through portion 110HB, and the like, descriptions regarding mounting or disposition of the electronic component, descriptions when the main board is applied to an electronic device such as a smartphone, etc., or the like, are substantially the same as described above with reference to FIGS. 1 to 7, and detailed descriptions thereof will be omitted.

Figure 10:
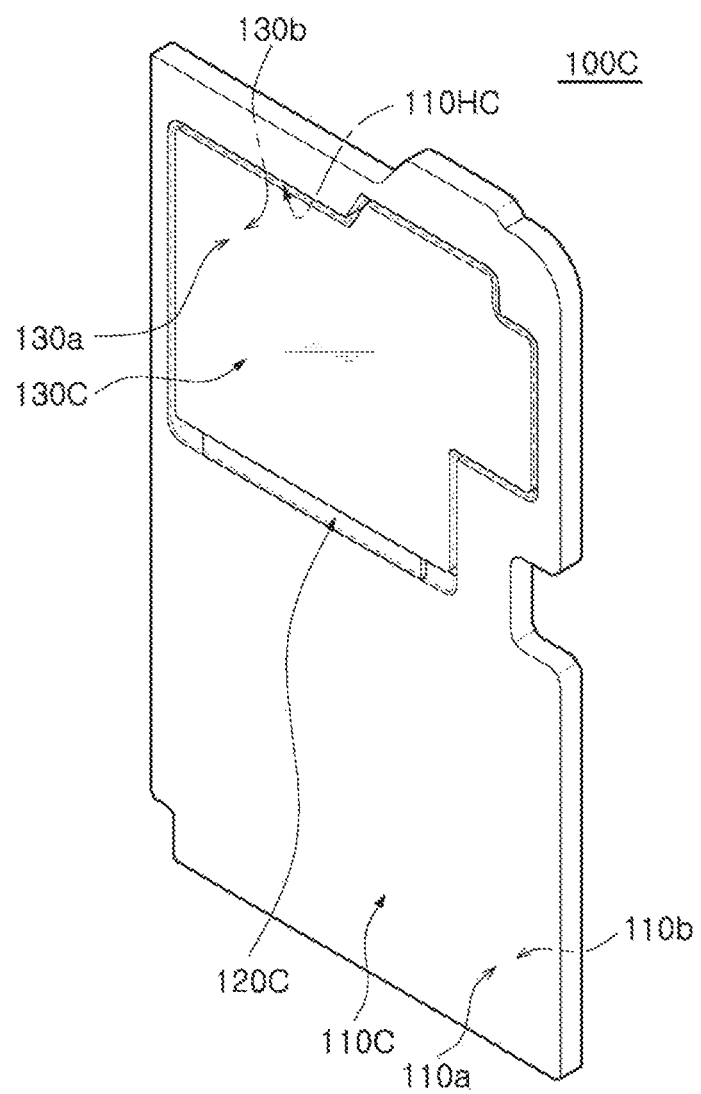
FIG. 10 is a schematic perspective view illustrating another example of a printed circuit board.
Figure 11:
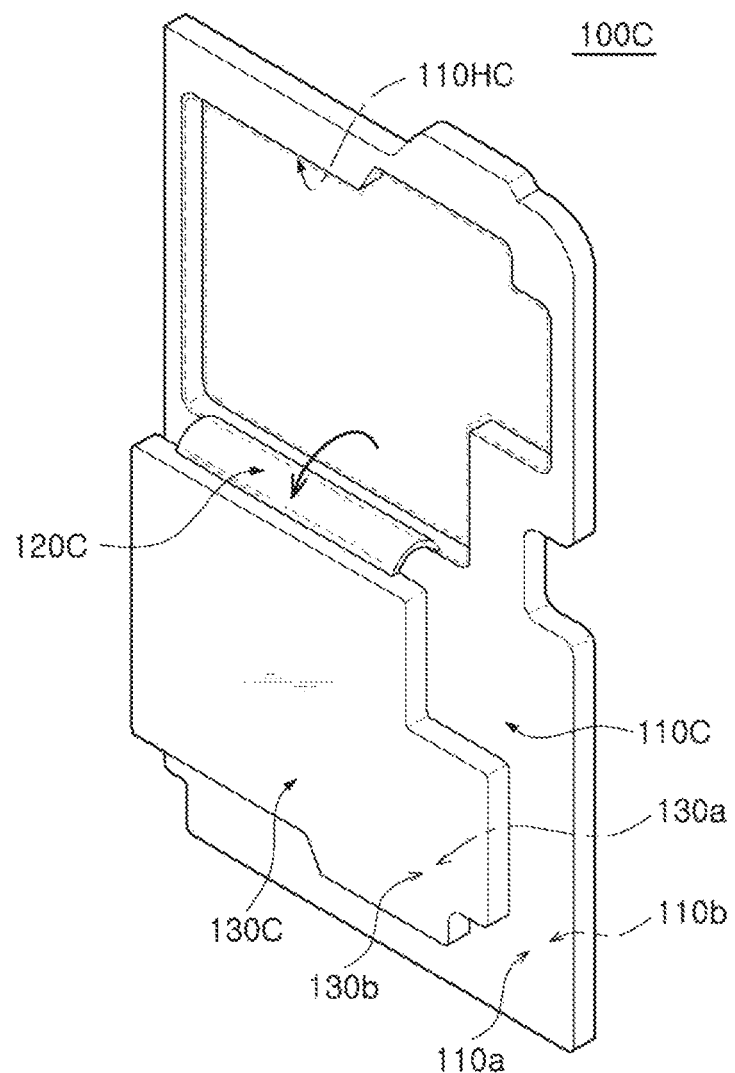
FIG. 11 is a schematic perspective view illustrating a condition after a flexible substrate of the printed circuit board of FIG. 10 is bent.

FIG. 10 is a schematic perspective view illustrating another example of a printed circuit board, and FIG. 11 is a schematic perspective view illustrating a condition after a flexible substrate of the printed circuit board of FIG. 10 is bent.

Referring to FIGS. 10 and 11, similarly to the printed circuit board according to the example, a printed circuit board 100C according to another example may also include a first substrate 110C having a first surface 110a and a second surface 110b, and having a through portion 110HC penetrating between the first and second surfaces 110a and 110b, a flexible substrate 120C connected to the first substrate 110C in the through portion 110HC, and a second substrate 130C connected to the flexible substrate 120C and having a third surface 130a and a fourth surface 140b. In this case, as shown in FIG. 10, before the flexible substrate 120C is bent, the second substrate 130C may be disposed in the through portion 110HC, and the flexible substrate in the through portion 110HC may be disposed between the first and second substrates 110C and 130C to connect the first and second substrates 110C and 130C. In addition, as shown in FIG. 11, after the flexible substrate 120C is bent, the second substrate 130C may be disposed on the first substrate 110C, and at least a portion of each of the first surface 110a of the first substrate 110C and the third surface 130a of the second substrate 130C may overlap each other on a plane. However, unlike the printed circuit board 100A according to the above-described example, the through portion 110HC may be completely surrounded by the first substrate 110C on a plane. For example, the through portion 110HC may be blocked by the first substrate 110C in all of the first to fourth directions described above. For example, the through portion 110HC may have a through hole shape. The first substrate 110C may have an inner-side side surface and an outer-side side surface that are disconnected from each other by the through portion 110HC. The second substrate 130c may be disposed in the through portion 110HC before the flexible substrate 120c is bent, and all side surfaces thereof may be surrounded by the first substrate 110C.

Other descriptions, for example, inconsistent detailed descriptions on the first and second substrates 110C and 130C, the flexible substrate 120C, the through portion 110HC, and the like, descriptions regarding mounting or disposition of the electronic component, descriptions when the main board is applied to an electronic device such as a smartphone, etc., or the like, are substantially the same as described above with reference to FIGS. 1 to 7, and detailed descriptions thereof will be omitted.

As used herein, the terms "side portion," "side surface," and the like, are used to refer to a direction toward a first or second direction or a surface on said direction. The terms "upper side," "upper portion", "upper surface," and the like, are used to refer to a direction toward a third direction or a surface on said direction, while the terms "lower side," "lower portion," "lower surface," and the like, are used to refer to a direction opposing the direction toward the third direction or a surface on said direction. In addition, said spatially relative terms have been used as a concept including a case in which a target component is positioned in a corresponding direction, but does not directly contact a reference component, as well as a case in which the target component directly contacts the reference component in the corresponding direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and do not necessarily refer to the same embodiment. Furthermore, the particular characteristics or features may be combined in any suitable manner in one or more embodiments. For example, a context described in a specific exemplary embodiment may be used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of several effects of the present disclosure, a printed circuit board that can secure sufficient component mounting space through efficient space utilization and an electronic device including the same may be provided.

In addition, according to the present disclosure, a printed circuit board that can form a multilayer structure with a relatively simple process and can reduce costs and an electronic device including the same may be provided.

While exemplary embodiments have been shown and described above, it will be apparent to those skilled in the art that modifications and variations could be made without departing from the scope of the present invention as defined by the appended claims.

What is claimed is:

1. An electronic device comprising:
a printed circuit board including a first substrate having a through portion, a flexible substrate connected to the first substrate in the through portion, and a second substrate connected to the flexible substrate and disposed on the first substrate such that at least a portion thereof overlaps the first substrate on a plane;
a first electronic component disposed on at least one surface of the first substrate; and
a second electronic component disposed on at least one surface of the second substrate,
wherein the printed circuit board further comprises a first connector disposed on one surface of the first substrate facing the second substrate, and a second connector disposed on one surface of the second substrate facing the first substrate,
wherein the first and second connectors are connected to each other, and
wiring layers of the first and second substrates are connected to each other through the first and second connectors.

2. The electronic device of claim 1, wherein the first and second electronic components are disposed on both surfaces of the first and second substrates, respectively.

3. The electronic device of claim 1, wherein the first and second electronic components comprise at least one of a semiconductor chip, a passive device, and a chip package including the same, respectively.

4. The electronic device of claim 1, further comprising a third electronic component disposed in the through portion, wherein the third electronic component is connected to at least one wiring layer of the first and second substrates.

5. The electronic device of claim 4, wherein the third electronic component comprises at least one of a camera module or a speaker.

6. The electronic device of claim 1, wherein one of the first and second connectors has a concave portion, and the other thereof has a convex portion, and
the first and second connectors are connected by coupling the concave portion and the convex portion.

7. The electronic device of claim 1, wherein the electronic component is a smartphone, and
the printed circuit board is a mainboard of the smartphone.

* * * * *